(12) United States Patent
Chann et al.

(10) Patent No.: US 8,824,049 B2
(45) Date of Patent: Sep. 2, 2014

(54) SCALABLE WAVELENGTH BEAM COMBINING SYSTEM AND METHOD

(71) Applicants: Bien Chann, Merrimack, NH (US); Robin Huang, North Billerica, MA (US)

(72) Inventors: Bien Chann, Merrimack, NH (US); Robin Huang, North Billerica, MA (US)

(*) Notice: Subject to any disclaimer, the term of this patent is extended or adjusted under 35 U.S.C. 154(b) by 0 days.

(21) Appl. No.: 14/053,529

(22) Filed: Oct. 14, 2013

(65) Prior Publication Data

US 2014/0036358 A1 Feb. 6, 2014

Related U.S. Application Data

(63) Continuation of application No. 13/042,243, filed on Mar. 7, 2011, now Pat. No. 8,559,107.

(51) Int. Cl.
*G02B 27/64* (2006.01)

(52) U.S. Cl.
USPC .......................................... 359/556; 356/621

(58) Field of Classification Search
USPC ............................................................ 359/556
See application file for complete search history.

(56) References Cited

U.S. PATENT DOCUMENTS

2007/0127123 A1* 6/2007 Brown et al. ................. 359/556

* cited by examiner

*Primary Examiner* — James Jones
(74) *Attorney, Agent, or Firm* — Ascentage Law, PLLC; Travis L. Johnson

(57) ABSTRACT

Systems and methods have been provided to scale wavelength beam combining (WBC) systems, which are systems configured to increase output power, as well as spatial and/or spectral brightness when utilizing or combining a plurality of beam emitters.

16 Claims, 2 Drawing Sheets

SCALABLE WAVELENGTH BEAM COMBINING SYSTEM AND METHOD

BACKGROUND OF THE INVENTION

1. Field of the Invention

The present embodiments relate generally to laser systems and more particularly to scalable wavelength beam combining systems and methods.

2. Description of the Prior Art

Wavelength beam combining (WBC) is a method for scaling the output power and brightness from laser diode bars, stacks of diode bars, as well as other lasers arranged in one or two-dimensional array.

WBC methods have been developed to combine beams to produce a multi-wavelength output beam. However, the traditional methods described therein do not allow for greater flexibility in scaling the overall footprint of the system and flexibility in addressing large aperture optic concerns while scaling the output power and brightness to produce kilowatts, tens and hundreds of kilowatts, and even megawatts of power. Improved methods and systems to increase spectral brightness and output power methods to meet various industrial, scientific and defense applications are needed.

The following application seeks to solve the problems stated.

SUMMARY OF THE INVENTION

A scalable wavelength beam combiner system comprising: a plurality of modular laser input devices, wherein each modular laser input device includes: at least one beam emitter configured to produce an electromagnetic beam, and at least one collecting optical element, wherein each collecting optical element collects the emitted beams and delivers the collected beams onto a dispersive element, and wherein the dispersive element transmits the collected beams as a combined beam profile; and a partially-reflecting output coupler arranged to receive the combined beams from the dispersive element, to reflect a portion of the combined beams toward the dispersive element, and to transmit the combined beams as a multi-wavelength beam comprising electromagnetic radiation having a plurality of wavelengths.

In some configurations a controller is used to manually or automatically turn on and off beam emitter modules based on the application need. For instance, in one configuration the controller receives input from a sensor that detects the power and wavelengths from the output of the system and can modify which beam emitters are to be turned on or off.

The systems and methods described herein address scaling WBC methods to produce high brightness and power. Some of the embodiments described herein use a plurality of modular laser input devices with each device being comprised of a plurality of beam emitters to form a scalable system. The scalability of using modular laser input devices allows for flexibility in adapting to higher or lower powers as needed, reducing the size of optics required and in some instances reducing the overall footprint of the system, which in turn creates a compact and robust system. This system is scalable to kilowatts, tens and hundreds of kilowatts, and even megawatts of power output and brightness.

DETAILED DESCRIPTION OF THE PREFERRED EMBODIMENT

Figure 1A:
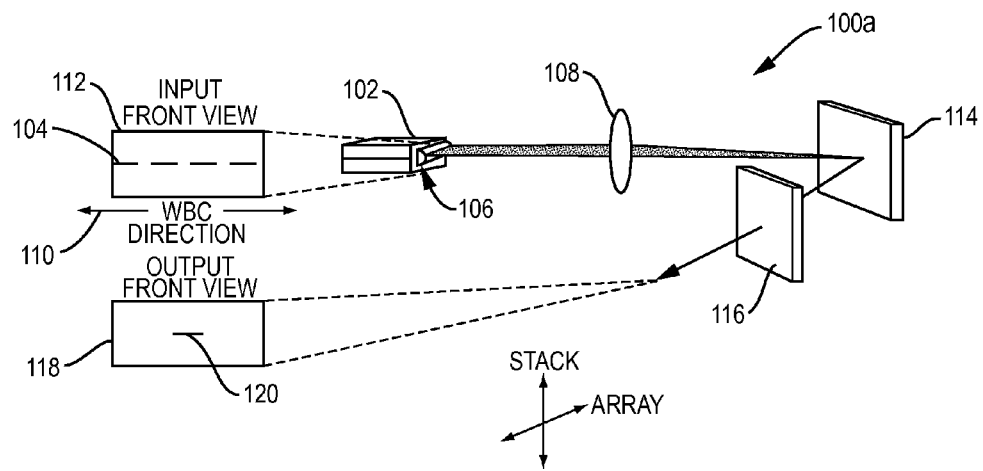
FIG. 1A is a schematic of a wavelength beam combining (WBC) method along the array dimension of a single diode laser bar of emitters.

Aspects and embodiments relate generally to the field of scaling laser sources to high-power and high-brightness using an external cavity and, more particularly, to methods and apparatus for external-cavity beam combining using both one-dimensional or two-dimensional laser sources. Aspects and embodiments further relate to high-power and/or high-brightness multi-wavelength external-cavity lasers that generate an overlapping or coaxial beam from ten to hundreds and even megawatts of output power.

In particular, aspects and embodiments are directed to a method and apparatus for combining individual laser emitters into modular units where a plurality of these modular units are all combined in a single system producing a single output profile that has been scaled in brightness and power. One advantage of the invention provided herein is a reduction in the size of optical elements required for scaling systems. Another advantage is that the overall footprint of the wavelength beam combining (WBC) system may be reduced in size.

The approaches and embodiments described herein may apply to one and two-dimensional beam combining systems along the slow-axis, fast-axis, or other beam combining dimension. For purposes of this application optical elements may refer to any of lenses, mirrors, prisms and the like which redirect, reflect, bend, collect or in any other manner optically manipulate electromagnetic radiation. Additionally, the term beam includes electromagnetic radiation. Beam emitters include any electromagnetic beam-generating device such as semiconductor elements, which generate an electromagnetic beam, but may or may not be self-resonating. These also include fiber lasers, disk lasers, non-solid state lasers, diode lasers and so forth. Generally each emitter is comprised of a back reflective surface, at least one optical gain medium, and a front reflective surface. The optical gain medium refers to increasing the gain of electromagnetic radiation and is not limited to the visual, IR or ultraviolet portions of the electromagnetic spectrum. An emitter, may be comprised of multiple beam emitters such as a diode bar configured to emit multiple beams. Many of the examples and embodiments used herein describe use a diode bar; however, it is contemplated that any emitter and in particular emitters having optical gain elements and particularly those with broad gain bandwidth may be used.

Wavelength Beam Combining

Wavelength beam combining (also called spectral beam combining or incoherent beam combining) does not require mutual coherence because it employs emitters with non-overlapping optical spectra whose beams are fed into a wavelength-sensitive beam combiner, such as a prism, a diffraction grating, a dichroic mirror, a volume Bragg grating, and the like to produce a wavelength combined beam. The general principle of wavelength beam combining is to generate several laser diode beams with non-overlapping optical spectra and combine them at a wavelength-sensitive beam combiner so that subsequently all of the beams propagate in the same direction.

To combine many diode lasers and achieve good beam quality, laser diodes that are combined must each have an emission bandwidth which is only a small fraction of the gain bandwidth. Beam quality during wavelength beam combining is further affected by the angular dispersion of the beam combiner. Beam combiners with sufficiently strong dispersion and wavelength stable laser diodes go a long way toward achieving good beam quality during wavelength beam combining. Techniques for tuning laser diode wavelengths to facilitate wavelength beam combining, range from independently tuning each laser to a predetermined wavelength, to automatically adjusting each laser diode beam wavelength based on its spatial position relative to the combined beam path.

Wavelength beam combining may be used for power scaling. While a simple example of nearly unlimited power scaling would be to tile collimated beams from a large number of independently running adjacent lasers, even though the combined power increases in proportion to the number of lasers, the beam quality of the combined output decreases while the brightness will be at best only equivalent to a single laser. Typically the brightness of the system is much lower than a single element. Therefore one can see that power scaling methods which conserve the beam quality of the beam combining elements are highly desirable.

Wavelength beam combining may be applied to various types of laser diode configurations including diode bars, diode stacks, and the like. A diode bar is a one-dimensional array of broad area laser emitters that can be combined with various fiber and optical systems to produce one or more wavelength combined beams. Diode bars may include two to fifty or more laser emitters on one linear substrate. Diode stacks are essentially a two dimensional array of diode. Diode bars can be fabricated into diode stacks in vertical stacking or horizontal stacking arrangements.

Laser Diode Arrays, Bars and Stacks

Laser diode arrays, bars and/or stacks, such as those described in the present application may be used in association with embodiments of the innovations described herein and in the exhibits referenced herein.

Laser diodes may be packaged individually or in groups, generally in one-dimensional rows/arrays (diode bar) or two dimensional arrays (diode-bar stack). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality and despite the higher power, the brightness is often lower than that of a broad area laser diode. High-power diode bars can be stacked to produce high-power stacked diode bars for generation of extremely high powers of hundreds or thousands of watts. Laser diode arrays can be configured to emit a beam into free space or into a fiber. Fiber-coupled diode-laser arrays can be conveniently used as a pumping source for fiber lasers and fiber amplifiers.

A diode-laser bar is a type of semiconductor laser containing a one-dimensional array of broad-area emitters or alternatively containing sub arrays containing 10-20 narrow stripe emitters. A broad-area diode bar typically contains 19-49 emitters, each being on the order of e.g. 1×100 μm wide. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that are usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators are used to collimate the output beam along the fast-axis. Array of aspherical cylindrical lenses are often used for collimation of each beam emitter along the array or slow-axis. To achieve beams with approximately circular beam waist a special beam shaper for symmetrization of the beam quality of each diode bar or array can be applied. A degrading property of diode bars is the "smile"—a slight bend of the planar nature of the connected emitters. Smile errors can have detrimental effects on the ability to focus beams from diode bars. Another degrading property is collimation error of the slow and fast-axis. For example, a twisting of the fast-axis collimation lens results in an effective smile. This has detrimental effects on the ability to focus. In stack "pointing" error of each bar is the most dominant effect. Pointing error is a collimation error. This is the result of the array or bar that is offset from the fast-axis lens. An offset of 1 μm is the same as the whole array having a smile of 1 μm.

Diode bars and diode arrays overcome limitations of very broad single emitters, such as amplified spontaneous emission or parasitic lasing in the transverse direction or filament formation. Diode arrays can also be operated with a more stable mode profile, because each emitter produces its own beam. Techniques which exploit some degree of coherent coupling of neighbored emitters can result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator and no beam conditioning in the slow-axis direction, or a more complex beam shaper to preserve the brightness better. It is also possible to launch the beamlets from the emitters into a fiber bundle (with one fiber per emitter).

Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength can also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack can be fabricated by attaching diode bars to thin heat sinks and stacking these assemblies so as to obtain a periodic array of diode bars and heat sinks. There are also horizontal diode stacks, and two-dimensional stacks.

For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g. by spatial interleaving of the outputs of different diode stacks, by polarization coupling, or by wavelength multiplexing. Various types of high-power beam shapers and related devices have been developed for such purposes. Diode stacks can provide extremely high output powers (e.g. hundreds or thousands of watts).

There are also horizontal diode stacks, where the diode bars are arranged side-by-side, leading to a long linear array of emitters. Such an arrangement is more easily cooled due to the naturally convective cooling that occurs between the vertically oriented diode bars, and may thus also allow for a higher output power per emitter. Generally, the number of diode bars in a horizontal stack (and thus the total output power) is more limited than in a vertical stack.

Diode bars and diode stacks can achieve very high power without significant cooling challenges by applying quasi-continuous-wave operation that includes generate pulses of a few hundred microseconds duration and a pulse repetition rate of some tens of hertz.

Basic WBC System

Often times 'simplifying' an optical system is thought of in terms of reducing the number of optical elements present in a particular system. Increasing the number of optical elements seems to increase the complexity of the system or manufacturability of the system. However, some of the embodiments described herein (particularly those shown in FIGS. 2A-B) increase the number of optical elements in a WBC system to achieve some of the advantages previously discussed, such as reducing the aperture of certain optical elements.

A basic WBC architecture is illustrated in FIG. 1a. Here array 102 is shown as a single bar having four beam emitters; however, it is contemplated that array 102 could have more beam emitters in or more bars along one or more rows or stacks. Individual beams 104 are illustrated in the figures by a dash or single line, where the length or longer dimension of the beam represents the slow diverging dimension and the height or shorter dimension represents the fast diverging dimension. A single collimation optic 106 is used to collimate each beam along the fast dimension. Collecting optic(s) 108, which could be a cylindrical lens, spherical lens, mirror or combination thereof, is used to collect each beam 104 along the WBC dimension 110 as shown by the input front view 112. Here the collecting optics 108 then overlaps the combined beam onto a dispersive element (here shown as a diffraction grating) 114 where the combined beam is then transmitted as single output profile onto a partially-reflective output coupler 116. This partially-reflective output coupler then transmits the combined beams 120 as shown by the output front view 118. The partially-reflective output coupler provides feedback into each of the emitters, which causes each emitter to stabilize at a particular or distinct wavelength. The stabilization is based in part of the angular dispersion of the dispersive element 114.

Figure 1B:
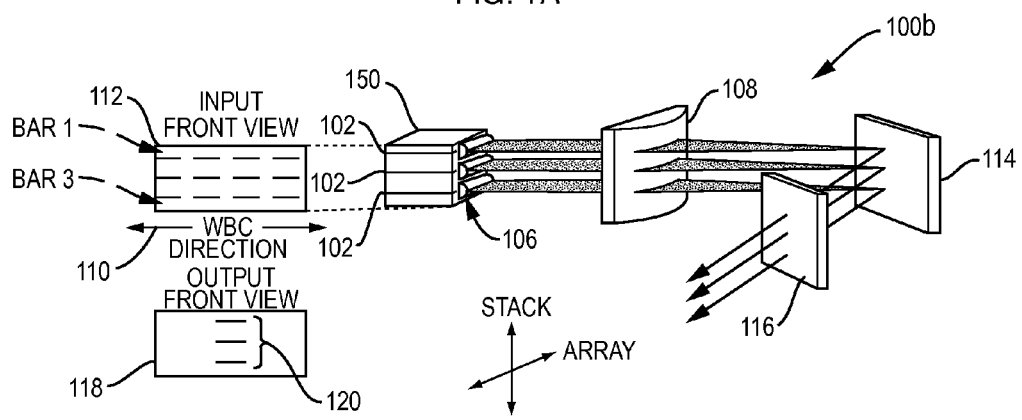
FIG. 1B is a schematic of a WBC method along the array dimension of a two-dimensional array of emitters.

Similarly, FIG. 1B illustrates a stack 150 of three laser arrays or bars 102 with each array having four beam emitters. As in FIG. 1A, the input front view 112 of FIG. 1B, which this time is a two-dimensional array of beams, is combined along the array dimension of the beams to produce the output front view 118 or single output profile 120 of a single column of beams.

Figure 1C:
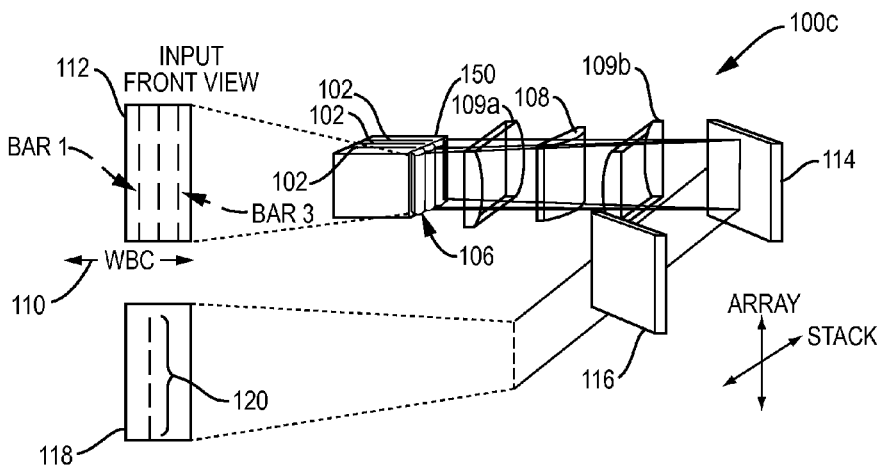
FIG. 1C is a schematic of a WBC method along the stack dimension of a two-dimensional array of emitters.

Another WBC method shown in FIG. 1C illustrates a stack 150 of laser arrays 102 forming a two-dimensional array of emitters where instead of combining the beams along the slow dimension as in FIGS. 1A-B, the WBC dimension 110 now follows along the stacking dimension of the beams arranged in a two-dimensional profile. The input front view 112 is now combined to produce the output front view 118 along the respective fast diverging dimension or axis wherein a single column of beams 120 is shown.

In the preceding WBC systems shown in FIGS. 1A-C an optical system that focused all the emitted beams onto a dispersive element is shown. Furthermore, the entire one-dimensional or two-dimensional input profile is reduced by a single optical element into a single output profile. However, as the number of beams increase along a single dimension, such as the column or stacking dimension or the array or row dimension, the size of the numerical aperture has to also increase in size spatially in order to accept the entire one or two-dimensional profile. Likewise, if the spacing between emitters increases the numerical aperture of the collecting would similarly need to increase in size to accept the more spread out or spatially distanced emitters. For example, a typical COTS diode stack has 2 mm pitch between the bars. Thus, if 100 bars are to be combined then the aperture of the collecting optics has to be at least 200 mm. Most COTS optics have diameters less than 75 mm, with 25 mm being the most common.

This becomes problematic if one of the design goals of a WBC system is to produce a compact system that combines a large number of beams or the individual beams are spatially spread out. When the aperture of an optical element becomes too large, manufacturing becomes more difficult and the cost generally increases. Making large aperture optics with low aberrations is a difficult task. Commercially-off-the-shelf optics with acceptable quality is generally limited to about 5 to 6 inches in diameter, with 1 inch being the most common.

Laser sources based on common "off-the-shelf" high power laser diode arrays and stacks are often based on broad-area diode beam emitters. Typically, the beam quality of these elements is diffraction-limited along the fast axis and many times diffraction-limited along the slow axis of the beam emitters. It is to be appreciated that although the following discussion may refer primarily to laser diodes, diode bars and diode stacks, embodiments of the invention are not limited to laser diodes and may be used with many different types of laser emitters, including fiber lasers, individually packaged diode lasers, semiconductor lasers and other types of lasers.

Furthermore, as used herein, the term "array" refers to one or more beam emitters placed side by side. The array dimension in FIGS. 1A-C is along the slow axis for broad-area emitters; however, it is contemplated that individual emitters aligned along the array dimension may be along the fast axis, an angle off the slow axis or randomized with respect to each emitter along the array or row. As used herein, the term "stack" refers to two or more arrays stacked together. A stack can be arranged mechanically or optically. In one example, a mechanically arranged stack includes two or more arrays, which are physically stacked on top of one another to produce output beams, which are stacked on top of one another. An optically arranged stack can be achieved by using optics, such as turning mirrors, to arrange the output beams from two or more arrays, each beam from a corresponding array, such that the output beams are stacked on top of one another. The stacking dimension in FIGS. 1A-C is along the fast axis; however, it is contemplated that individual emitters aligned along the stacking or column dimension may be along the slow axis, an angle off the slow axis or randomized with respect to each emitter along the stack or column. The laser can be operated as a quasi-continuous wave (QCW) or CW with output power from sub-milliwatt to tens of Watts or higher.

As noted, Wavelength beam combining (WBC) of beam emitters is an attractive method for scaling power and brightness from a laser system. Brightness is product of $N*P/(\lambda^2 * M^2_x * M^2_y)i$, where N is the total number of combining elements, P is the output power of each element, and $\lambda$ is the operating wavelength, $M^2_x$, $M^2_y$ are the beam qualities along the two dimensions whereas $N*P$ is the power.

Generally, all three WBC cavities consist of an array or stack of beam emitters, a collecting optic(s) (cylindrical lens, spherical lens or mirror), a dispersive element (shown using a diffraction grating), and a partially reflecting output coupler. The collecting optic(s) is placed after the laser array. The position of the collecting optics may depend on the source and desired output profile. For example, in one configuration the collecting optic is placed a focal length away from the emission source on side and the dispersive element on the other side. This configuration causes the emitted beams to be spatially overlapped at the dispersive element. However, in some configurations the dispersive element is not placed a focal length away, which may result in degradation in output beam quality or beam parameter product (BPP). It may be desirable to vary the BPP for particular applications. For the configuration where the collecting optic overlaps the beams onto the dispersive element, the partially-reflective output coupler is usually placed to receive an order of the diffracted beams and reflect a portion of those beams back toward each original emitter thus creating a multi-wavelength output with individually stabilized beams that are combined to have the size and quality of a single emitter.

Scaling WBC Systems

For scaling to higher power and higher brightness, this basic optical setup for the three WBC cavities discussed above may be limiting and at times impractical. To illustrate this point, an example using the WBC system setup as shown in FIG. 1C is described. Assume that a 3000-watt WBC system is desired. Typical commercial-off-the-shelf (COTS) laser diode bars having multiple emitters that are rated at 100 watts of total output power per bar. Thus, in order to achieve 3000 watts, 30 of these 100-watt laser diode bars are required. The pitch between diode bars of this type is typically approximately 2.0 mm. If 30 bars are stacked in a configuration like that in FIG. 1c, the width of the stack along the stacking dimension becomes 29×2=58 mm. The diameter of the collecting optic required to receive the entire beam profile needs to be slightly larger so a standard size of 75 mm, or 3 inches would be an appropriate size. Optics with low aberrations are commercially available at this diameter but are more expensive and less common.

Scaling the previous illustration from a 3000-watt to a 10 kilowatt system would now require the size of the optic to be 3.3 times larger, or about 191.4 mm (~10 inches). Procuring a 10-inch diameter optics with low aberrations is very expensive and requires time-consuming custom optical fabrication. It makes a 10 kilowatt system not competitive in the market place. Additionally, assuming the spectral bandwidth of the 3000 W and 10 kW is the same, then the focal length of a 10-inch is also going to increase the distance between the collecting optic/mirror to the diffraction grating by roughly a factor of 3.

Figure 2A:
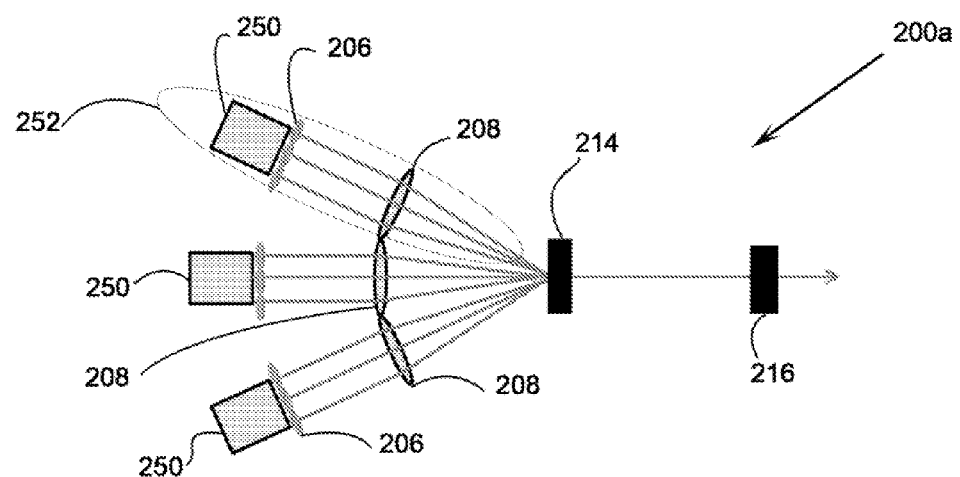
FIG. 2A is a schematic showing an embodiment for scaling a WBC system to tens of kilowatts or more.

One embodiment addressing the issue of using optical elements with larger apertures is illustrated in FIG. 2A. Here, a WBC expansion system 200a uses a plurality of collecting optics 208 to receive emitted beams from a plurality of modular units comprised of one or more beam emitters. By parsing stacks of emitters into individual modules with a smaller beam-input profile, collecting optics with a smaller numerical aperture may be used. Additionally, the modularizing of the stacks allows for a system with greater flexibility. This flexibility includes the ability to replace one module at a time, adding additional modules to a system when increased power is required, and turning individual modules on and off. Another advantage is to mix and match modules with distinct wavelength bands into the combined output profile. By having a 'plug and play' system the flexibility of scaling systems, maintaining systems and diversifying the capability of the applications of the system become more advantageous. Other advantages will become apparent to one skilled in the art.

WBC expansion system 200a consists of a plurality of beam emitters 250 producing a one or two-dimensional profile, a collecting optic(s) for each set of beam emitters 250, a dispersive element and a partially-reflective output coupler. The individual laser input modules 252 of system 200a are comprised of a set of plurality of beam emitters 250, which forms a one or two-dimensional profile and a collecting optics 208. Additionally, as illustrated in FIG. 2A, a laser input module may include collimation optics, for example a fast-axis collimation optic or FAC optic, 206 configured to collimate the beams along the fast axis. Other optical elements may be included, but a basic laser input module includes at least two emitters and a collecting optic. Each set of laser emitters 250 and collecting optic 208 are oriented such that all the beams from all the laser emitters are spatially overlapped on the diffraction grating 214. The collecting optic of each stack may be placed a single focal length from the back-focal plane of the FAC optic 206. The diffraction grating 214 may be placed where all the beams are overlapped; nominally, this is at the focal plane of each of the collecting optics 208. The output coupler 216 is generally placed in the path of the first-order diffracted beam. In this embodiment output coupler 216 may be partially reflective and when combined with the diffraction grating 214 provide feedback for unique wavelength control of the laser emitters. This is sometimes referred to as wave locking. In addition the grating and output coupler produce beam overlap both in the near field (at the output coupler) and in the far field, thereby forming a single output profile.

Continuing with the previous illustration of using laser diode bars where we assume the largest optical elements to be tolerated is 3 inches, and then beam emitters 250 would be comprised of a stack consisting of 30 diode bars. Thus each laser input module 252 would produce 3000 watts of total power and system 200a as illustrated in FIG. 2A having three laser input modules would produce 9000 watts, assuming 100% efficiency. Adding a fourth or nth laser input module would increase the output of the external cavity by an additional 3000 watts.

Figure 2B:
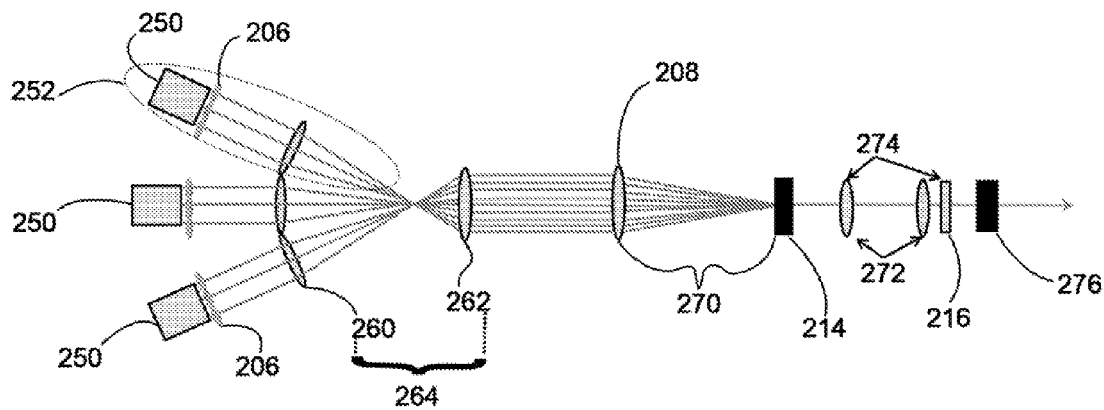
FIG. 2B is another schematic showing an embodiment for scaling a WBC system to tens of kilowatts or more, wherein telescoping optics have been incorporated.

Another implementation is shown in FIG. 2B. Some of the practical considerations when designing high power laser systems include: finite gain bandwidth of beam emitters, acceptance angle of the dispersive element, spot size on dispersive element, and overall size of the system. WBC expansion system 200b includes a secondary telescoping optic 262 configured to form a telescoping system 264 that reduces the aperture size of the overall profile as well as individual beams from each of the laser input modules 252. This reduction of the profile allows for collecting optic 208 to have a smaller aperture, which in turn helps reduce the distance 270 between collecting optic 208 and diffraction grating 214. The laser input modules 252 in system 200b, as shown, consist of beam emitters 250, FAC optic 206 and a primary telescoping optic 260, which when coupled with secondary telescoping optic 262 forms the telescoping system 264. Similarly to the embodiment in FIG. 2A, laser input modules 250 in FIG. 2B may include additional optical elements, but in base form require at least two laser emitters and an optical element configured to spatially reduce the distance between beams along at least one dimension. These optical elements in the base laser input module may include a cylindrical or spherical lens or mirror. The additional telescope helps alleviate most of these. The overall size is dictated by the focal length of the collecting optics. For example, using a 10-mm wide diode array at 976 nm with a f=100 mm collecting optic, and 1600 lines per mm grating results in a size, along one dimension, that is roughly 2 times the focal length of the collecting optics or about 200 mm. However, using a f=10 mm and f=1 mm telescope, and f=10 mm collecting optics results in a much smaller size of about 42 mm. The output beam characteristics are identical to a single f=100 mm collecting optics. The spectral bandwidth of both cases is about 39 nm. 39 nm is about the gain bandwidth of the diode lasers at 976 nm. Thus adding more beam emitters to the single-transform-optics system would not work. However, if in the second example, the transform optics is changed to f=20 mm the spectral bandwidth is reduced by 2× or for the same spectral bandwidth two 10-mm wide bar can be wavelength beam combined. This increased the overall size from roughly 42 mm to 62 mm. If the transform lens is changed to 100 mm the overall size is about 222 mm, comparable to the single transform optics design, but now 10 times more beam emitters can be combined or roughly 10× brighter system.

The addition of the telescope may also reduce the spot size on the grating. For example, a typical diode bar has a f=900 um collimation optic attached. Assuming ideal collimation the collimated beam has a divergence angle of about 1 mrad. Thus, if a f=100 mm focusing optic were used, the spot size on the grating would about 100 um along the WBC dimension. Such a small spot size is not generally desired as the power density might be more than the grating could handle and result in potential optical damage to the grating.

With the additional telescope the spot size on the grating may be increased by the telescope magnification. In the previous example using f=10 mm f=1 mm or 10× magnification the spot size on the grating is now 1 mm instead of 100 μm. At the same time the spectral bandwidth is reduced from 39 nm to 3.9 nm per bar. Thus, as stated earlier, 10 bars can be combined to use all of the 39 nm bandwidth. One example of as shown in FIG. 2B consists of multiple diode stacks, a telescope using an array of lenses and a common lens, a collecting optic, a grating, a telescope along the WBC dimension, a telescope along the non-WBC dimension, and an output coupler. Along the WBC dimension, as shown in FIG. 2B, an array of lenses 260 and a common lens 262 form an array of telescopes 264. Each laser module has its own telescope. The laser modules and array of telescopes are positions such that all beams are nominally parallel to each other after the telescopes. Thus, its function is to reduce the size of each emitter and the overall size from all the laser modules to the appropriate desired size.

The reduction in beam size after telescope will lead to larger beam size on the grating and thus lower the power density by the same factor. This reduction in stack size will result in better utilization of spectral bandwidth as shown in the above example. Thus, reduced images of the stacks are formed at the focal plane of the common optic of the telescope. The collecting optic overlaps them onto the diffraction grating. The grating and output coupler force each laser bar to operate at a unique and controlled wavelength. In this manner, all the beams are spatially overlapped both in the near field and the far field. The telescope between the grating and output coupler is used to reduce the beam size along the beam combining dimension.

Along the non-WBC dimension additional optics may be needed such that all the beams along the non beam combining dimension are propagating normal to the output coupler. For example, a telescope placed along the non-WBC dimension between the grating and output coupler may be used to reimage the laser array onto the output coupler. In this way, the resultant output beam is the same as that of a single bar.

In one design example, we assume the lens array is a spherical lens is a 3-inch diameter optic with a focal length of 300 mm. The stack consists of 30 bars at 2 mm pitch. We assume that the common telescope optics is cylindrical optic has a focal length of 2.8 mm. We also assume that grating has a groove density of 1760 lines per mm. The collecting optic has a focal length of 200 mm. Thus, the bandwidth of the laser stack is approximately 0.78 nm. For a ten 30-bar stacks the bandwidth is approximately 10×0.78/ff, where ff is the stack-to-stack fill factor. For a stack-to-stack fill factor of 0.9, the bandwidth is approximately 8.7 nm. The beam size on the grating is approximately 100 mm. If a spatial inter-leaver is used with polarization multiplexing, up to 10 (the number of stacks)×30 (the number of bars per stack)×2 (the effect of the spatial inter-leaver)×2 (due to polarization)=1200 bars can be combined with an output beam quality of a single bar with bar power of 1200×100 W=120,000 W and spectral line width of approximately 8.7 nm.

Low-Cost, Highly Reliable, High-Brightness Diode Laser System

Highly reliable diode laser systems are in great demand for industrial applications. Industrial customers typically demand that the system last up to 100,000 hours, or more than 11 years. The lifetime of lasers varies by the laser type. The lifetime of actively cooled diode lasers using micro-channel coolers is approximately 10,000 hours or longer. Passively cooled diode lasers have a lifetime of approximately 20,000 hours or longer. The lifetime of sealed-tube CO2 lasers is approximately 35,000 hours with little maintenance required. Sealed-tube CO2 lasers are limited to a few hundred Watts. High-power, kW-class CO2 laser systems typically last up to 100,000 hours or longer; however, they require maintenance every 1,000 hours and a complete optical rebuild every 8,000 hours. Lamp-pumped solid state lasers have approximately the same cycle time as high power CO2 lasers. The lifetime of diode-pumped solid lasers, including fiber and bulk solid state, is much shorter than CO2 lasers. At best the lifetime is limited by the lifetime of the diode lasers. In this disclosure we show that the lifetime of our high-brightness WBC diode lasers can have a lifetime of up to 50,000 hours, 100,000 hours or greater without any need for maintenance.

In most cases, the output power of diode lasers has a linear dependence on time and is approximately $$P(t) \approx P_0 - \beta t,$$

where $P_0$ is the initial power, $P(t)$ is the laser power at time t later, and $\beta$ is the degradation rate. For passively cooled diode bars the degradation rate is approximately $\beta \sim 1 \times 10^{-5}$ W per hour. Therefore, for passively cooled diode bars the end of life occurs at approximately 20,000 hours, where the end of life is defined as the time at which the output power is 80% of the initial value. To illustrate the intrinsic advantages of our system let us consider a 1,000-W system. Let us assume the cost of the diode laser is $10/W. Thus, for the 1,000-W system the cost of the diode is $10,000. We assume that our system may be required to last 100,000 hours. If we build our system with 1,000 W of diode lasers in the system we have to have to replace the diode lasers every 20,000 hours. Thus, we have to replace 4,000 W worth of diode lasers. The cost of the replacement is therefore $40,000 plus labor. All diode-pumped solid state lasers, including bulk Nd:YAG, thin disk, and fiber lasers, have to follow this model. This is fundamental of the laser resonator for diode-pumped solid state lasers. For example, in bulk Nd:YAG lasers, once the diode reaches its end of life condition, it has to replaced. It has to be replaced and the entire laser must be realigned optically. Fundamentally, this requirement may not apply to WBC systems. In our system the output beam is invariant with respect to the number of laser bars, the number of elements, or the output power of the system. For example, if we design a 1,000-W system we can install a multiplicity of 1,000 W diode laser groups in our system and just turn on one group at a time. At the end of 20,000 hours simply turn off the first group of diode lasers and turn on the second group or combination. Thus, replacement and/or realignment to the system are unnecessary. This is a fundamental property of our system. Intrinsic to our system, even though the diode lasers only last 20,000 hours we can make a laser system that lasts 100,000 hours, or any length of time desired. It is possible to reduce the number of replacement diode lasers required from the straightforward example described above. For example, when we manufacture the diode laser system, we install a total of 2,000 W worth of diode laser power. The 2,000-W laser would consist of 5 clusters of diode lasers. The first cluster has a power level of 1,200 W. The rest of the clusters are at 200 W each. For the first 20,000 hours we run just the 1200-W cluster until its end of life at the power level of 1000 W. At the end of 20,000 hours we run clusters 1 and clusters 2. At the end of 40,000 hours we run clusters 1, 2, and 3. At the end of 60,000 hours we run clusters 1, 2, 3, and 4. At the end of 80,000 hours we run all of the clusters. The output power from the system at any given time is always approximately at 1,000 W. In this example the total cost of the diode lasers is $20,000 instead of the previous example's $50,000 ($10,000 for the initial diodes plus $40,000 for the replacement diodes). More importantly there is no scheduled maintenance needed. We never have to open the sealed laser system to replace and realign the system. As part of the system, the cluster operation is programmed and controlled by a computer with a simple power threshold detector. If the diode lasers turn out to be more reliable than expected from the mean lifetime, the computer may not need to turn on additional clusters until the system power is lower than a pre-set threshold, which may further extend the operation time. The above example shows just one possible sequence of operating various clusters. A multiplicity of possible system scenarios exists. Furthermore, it is possible to combine this approach with de-rating the power from each cluster of diode lasers, which results in further, possibly drastic, improvements on the baseline lifetime expected for each cluster.

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A scalable wavelength beam combiner system comprising:
   a plurality of modular laser input devices, wherein each modular laser input device includes:
      at least one beam emitter configured to produce an electromagnetic beam, and
      at least one collecting optical element, wherein each collecting optical element collects the emitted beams and delivers the collected beams onto a dispersive element, and wherein the dispersive element transmits the collected beams as a combined beam profile; and
   a partially-reflecting output coupler arranged to receive the combined beams from the dispersive element, to reflect a portion of the combined beams toward the dispersive element, and to transmit the combined beams as a multi-wavelength beam comprising electromagnetic radiation having a plurality of wavelengths.

2. The system of claim 1, wherein the collecting optical element has a diameter less than or equal to five inches.

3. The system of claim 1, wherein each modular laser input device is configured to be selectively turned on and off.

4. The system of claim 1, wherein each modular laser input device produces a bandwidth distinct from the other modular laser input devices.

5. The system of claim 1, wherein each modular laser input produces at least 100 Watts of power.

6. The system of claim 1, wherein the single output profile has a minimum brightness and output power maintained for at least 50,000 hours.

7. The system of claim 1, wherein the dispersive element is placed less than focal length of the collecting optic away from the collecting optic.

8. The system of claim 1, wherein the dispersive element is placed greater than a focal length of the collecting optic away from the collecting optic.

9. The system of claim 1, further including a sensing system configured to detect data of the single output profile.

10. The system of claim 9, further including a controller configured to receive the output data and selectively turn on or off laser input modules.

11. A scalable wavelength beam combiner system comprising:
   a plurality of modular laser input devices, wherein each modular laser input device includes:
   a plurality of beam emitter modules each configured to produce an electromagnetic beam;
   at least one primary telescoping optic for each laser module, wherein the primary telescoping optic is configured to receive an emitted beam from a respective laser module;
   a secondary telescoping optic aligned to form a telescoping system with each of the primary telescoping optics, wherein the telescoping system aligns the beams parallel to each other;
   a collecting optic configured to receive the parallel beams and cause the parallel beams to initially converge along a beam combining dimension;
   a dispersive element positioned to receive beams from the collecting optic and transmit the beams as a combined beam profile; and a partially-reflecting output coupler arranged to receive the combined beams from the dispersive element, to reflect a portion of the combined beams toward the dispersive element, and to transmit the combined beams as a multi-wavelength beam comprising electromagnetic radiation having a plurality of wavelengths.

12. The system of claim 11, wherein the collecting optic has a diameter less than or equal to five inches.

13. The system of claim 11, wherein the collecting optic is a curved mirror with a diameter less than or equal to five inches.

14. A method for scaling a WBC system comprising the steps of:
   arranging a plurality of collecting optics to each receive and deliver at least one emitted electromagnetic beam onto a dispersive element;
   transmitting the beams from the dispersive element as a combined beam profile;
   reflecting a portion of the combined beams back towards the dispersive element; and
   transmitting the combined output profile as a multi-wavelength beam comprising optical radiation having a plurality of wavelengths.

15. A method for a scaling an external cavity WBC system comprising the steps of:
   receiving emitted electromagnetic beams from modules of one or more beam emitters into an optical telescoping system having more than one input surface, wherein the telescoping system has an input surface for each module;
   aligning all the received beams parallel to each other;
   causing the parallel beams to initially converge;
   collecting the converging beams onto a dispersive element;
   transmitting a combined beam profile from the dispersive element;
   reflecting a portion of the combined beams back into the beam emitters; and
   transmitting a multi-wavelength beam comprising optical radiation having a plurality of wavelengths.

16. The method of claim 15, further comprising the step of collimating the emitted beams along at least one dimension prior to being received by the telescoping system.

* * * * *